United States Patent
Mir Shafiei et al.

(10) Patent No.: US 10,236,662 B2
(45) Date of Patent: Mar. 19, 2019

(54) LASER APPARATUS HAVING A COMPOSITE LASER CAVITY

(71) Applicant: TELEFONAKTIEBOLAGET LM ERICSSON (PUBL), Stockholm (SE)

(72) Inventors: Mehrdad Mir Shafiei, Montreal (CA); Robert Brunner, Montreal (CA); Stephane Lessard, Mirabel (CA)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 15/771,695

(22) PCT Filed: Nov. 11, 2015

(86) PCT No.: PCT/IB2015/058722
§ 371 (c)(1),
(2) Date: Apr. 27, 2018

(87) PCT Pub. No.: WO2017/081514
PCT Pub. Date: May 18, 2017

(65) Prior Publication Data
US 2018/0351327 A1     Dec. 6, 2018

(51) Int. Cl.
*H01S 5/00* (2006.01)
*H01S 5/10* (2006.01)
(Continued)

(52) U.S. Cl.
CPC ............ *H01S 5/105* (2013.01); *H01S 5/0071* (2013.01); *H01S 5/0078* (2013.01); *H01S 5/021* (2013.01);
(Continued)

(58) Field of Classification Search
CPC ...... H01S 5/105; H01S 5/0071; H01S 5/0078; H01S 5/021; H01S 5/026; H01S 5/1003;
(Continued)

(56) References Cited

U.S. PATENT DOCUMENTS 4,631,730 A * 12/1986 Miller ................. H01S 5/06256
372/19
6,418,251 B1 * 7/2002 Boscha ................ G02B 6/4204
372/29.02
(Continued)

FOREIGN PATENT DOCUMENTS

WO        WO86/02208 A1    4/1986

OTHER PUBLICATIONS

Naoki Kobayashi et al.: Silicon Photonic Hybrid Ring-Filter External Cavity Wavelength Tunable Lasers; Mar. 15, 2015, 6 pages.
(Continued)

*Primary Examiner* — Kinam Park
(74) *Attorney, Agent, or Firm* — Julie Dufort; Ericsson Canada Inc.

(57) ABSTRACT

The teachings herein disclose a laser assembly (20) that implements a "composite cavity" formed in part in a III/V die (22), in part in a silicon die (26), and in part in a glass member (24) having a waveguide (44) coupling the cavity portion in the III/V die with the cavity portion in the silicon die. This arrangement capitalizes on the lasing efficiency of the III/V die, which is used as the gain medium while advantageously using the glass member to extend the lasing cavity into the silicon die. Laser-scribing the cavity waveguide in place after mounting the III/V die, the silicon die or dies, and the glass member, greatly relaxes the mounting alignment precision needed for the constituent parts of the overall assembly. Moreover, in one or more embodiments, glass member includes one or more laser-scribed waveguides operative as optical interconnects going between two or more silicon dies.

15 Claims, 4 Drawing Sheets

(51) Int. Cl.
*H01S 5/026* (2006.01)
*H01S 5/14* (2006.01)
*H01S 5/125* (2006.01)
*H01S 5/02* (2006.01)
*H01S 5/323* (2006.01)
*H01S 5/30* (2006.01)

(52) U.S. Cl.
CPC ............ *H01S 5/026* (2013.01); *H01S 5/0268* (2013.01); *H01S 5/1003* (2013.01); *H01S 5/1032* (2013.01); *H01S 5/125* (2013.01); *H01S 5/141* (2013.01); *H01S 5/3013* (2013.01); *H01S 5/323* (2013.01); *H01S 5/3235* (2013.01); *H01S 5/32341* (2013.01)

(58) Field of Classification Search
CPC ........ H01S 5/1032; H01S 5/125; H01S 5/141; H01S 5/0268; H01S 5/3013; H01S 5/323; H01S 5/32341; H01S 5/3235
See application file for complete search history.

(56) References Cited

U.S. PATENT DOCUMENTS

| | | | |
|---|---|---|---|
| 2008/0285610 A1* | 11/2008 | Hall | C03C 13/048 372/45.011 |
| 2014/0056554 A1* | 2/2014 | Brunner | G02B 6/1221 385/14 |
| 2014/0161385 A1* | 6/2014 | Lessard | G02B 6/122 385/14 |
| 2015/0180201 A1 | 6/2015 | Zhang et al. | |
| 2018/0017748 A1 | 1/2018 | Mir Shafiei et al. | |

OTHER PUBLICATIONS

Jean-Philippe Berube et al.: "Femtosecond laser-induced refractive index modifications in fluoride glass" Feb. 2013, 14 pages.
A. Corradi et al.: Integrated dual-wavelength AWG-lasers for millimeter wave generation; Feb. 2, 2012, 2 pages.

* cited by examiner

LASER APPARATUS HAVING A COMPOSITE LASER CAVITY

TECHNICAL FIELD

The present disclosure relates to lasers.

BACKGROUND

An essential part of any optical system is a light source. A laser is an optical oscillator that consists of an active medium for amplification, a cavity formed between two mirrors and a way to partially couple light out of the cavity. FIG. 1 illustrates a laser cavity 10 in general form. The illustrated cavity 10 includes a gain medium 12, a first mirror 14, a second mirror 16, and an optical filter 18. For single mode operation, the filter 18 is configured to select among the possible cavity modes. The laser output is extracted from the cavity 10 through the mirror 16, which is partially reflective.

Lasing in silicon is challenging because of its indirect bandgap, meaning that silicon is inefficient for use as the gain medium 12. Providing light sources to silicon dies thus represents a major challenge in many areas of development, such as the development of silicon dies configured for photonics-based processing. Such dies are often referred to as "silicon photonics chips" and several solutions have been proposed in the literature for providing lasing sources to such chips, such as using off-chip external lasers, bonding III/V active material directly onto the silicon dies, or flip-chip bonding of laser dies onto the silicon dies. Example III/V materials include Gallium Arsenide (GaAs), Indium Phosphide (InP), Gallium Phosphide (GaP) and Gallium Nitride (GaN).

SUMMARY

In an example embodiment, there is provided a laser assembly including a III/V die configured as a semiconductor gain medium and operative as a first portion of a composite laser cavity. The first portion of the composite laser cavity includes a first mirror acting as a first end of the composite laser cavity. The laser assembly further includes a glass member including a laser-scribed optical waveguide operative as a second portion of the composite laser cavity, and a silicon die operative as a third portion of the composite laser cavity. The third portion includes a second mirror acting as a second end of the composite laser cavity. The partially reflective nature of the second mirror allows a portion of the laser light from the composite laser cavity to pass into the silicon die, e.g., for use in photonics processing.

DETAILED DESCRIPTION

The teachings herein disclose a laser assembly that implements a "composite cavity" formed in part in a III/V die, in part in a silicon die, and in part in a glass member having a waveguide coupling the cavity portion in the III/V die with the cavity portion in the silicon die. This arrangement uses the lasing efficiency of the III/V die, which is used as the gain medium and uses the glass member to extend the lasing cavity into the silicon die. Laser-scribing the cavity waveguide in place after mounting the III/V die, the silicon die or dies, and the glass member, greatly relaxes the mounting alignment precision needed for the constituent parts of the overall assembly. Moreover, in one or more embodiments, the glass member includes one or more laser-scribed waveguides operative as optical interconnects going between two or more silicon dies.

Figure 1:
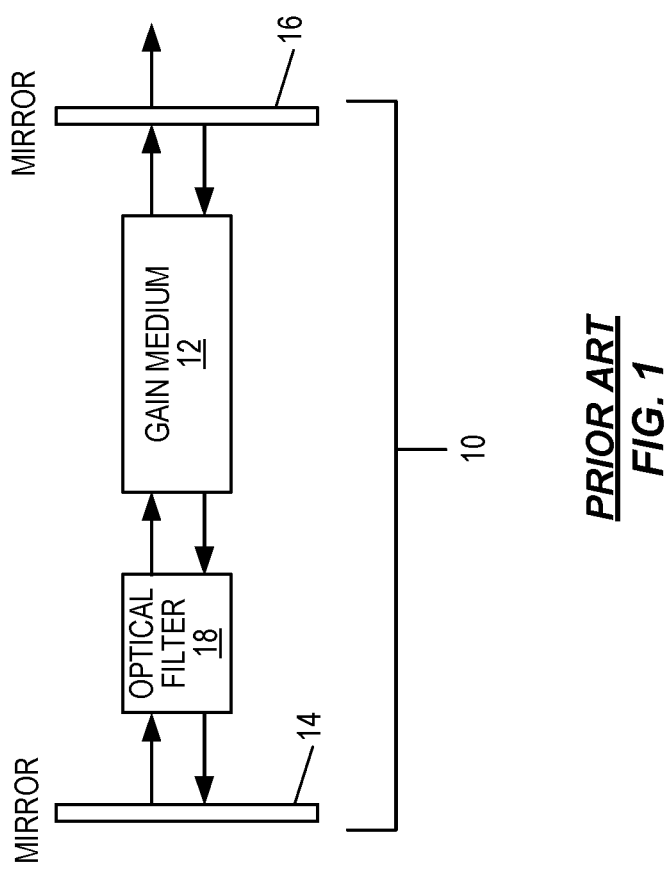
FIG. 1 is a block diagram of a typical laser cavity arrangement.
Figure 2:
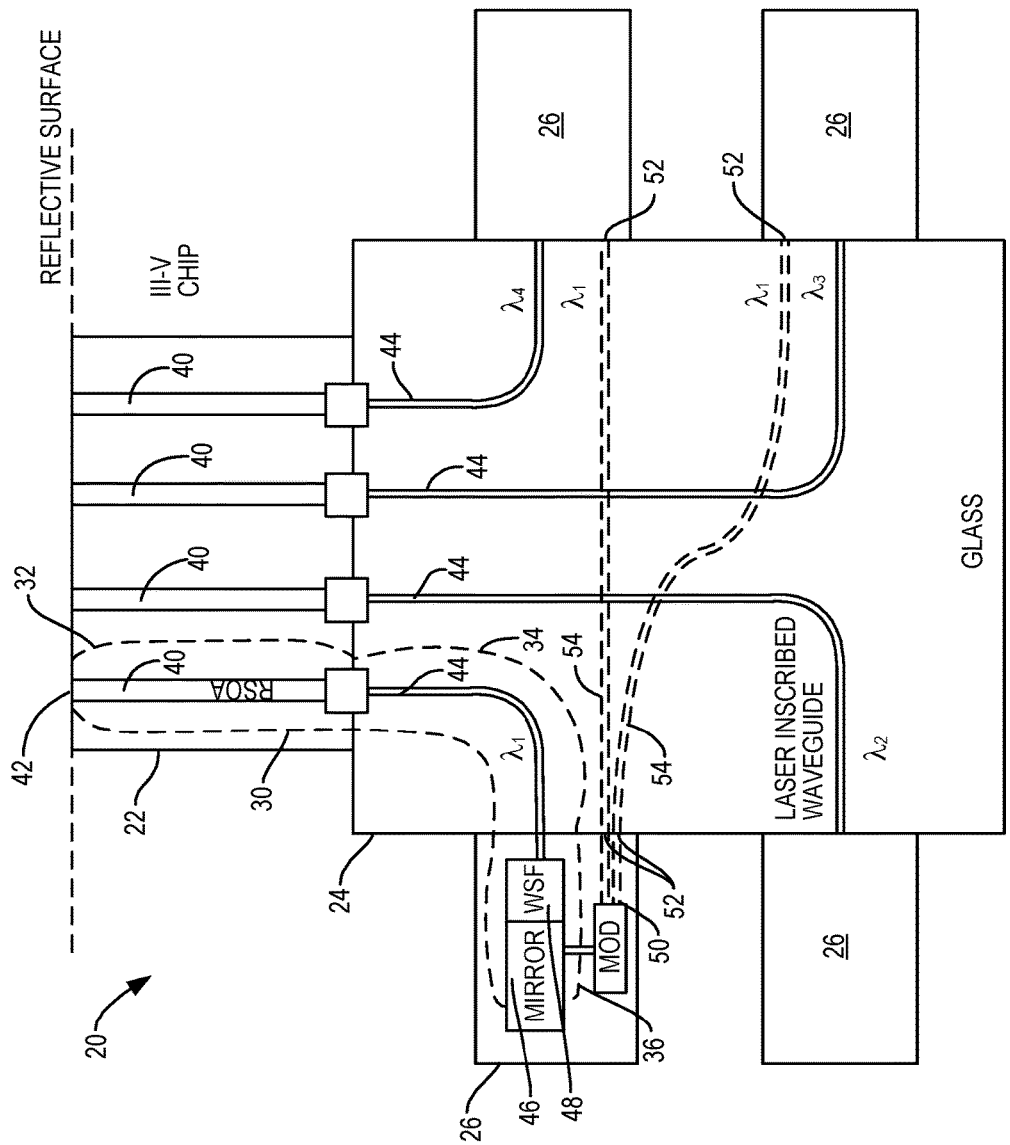
FIG. 2 is a block diagram of one embodiment of a laser assembly having a composite laser cavity.

FIG. 2 illustrates an example embodiment of a laser assembly 20. Included in the laser assembly 20 are a III/V die 22, a glass member 24, and silicon die 26. These elements cooperatively form a composite laser cavity 30 having a first portion formed in the III/V die 22, a second portion 34 formed in the glass member 24, and a third portion 36 formed in the silicon die 26.

The first portion 32 includes a first mirror 42 acting as a first end of the composite laser cavity 30, which here is provided by a reflective surface implemented in association with a reflective semiconductor optical amplifier, RSOA, 40 fabricated in the III/V die 22.

Correspondingly, the glass member 24 includes a laser-scribed optical waveguide 44 operative as the second portion 34 of the composite laser cavity 30, and the third portion 36 of the composite laser cavity includes a second mirror 46 acting as a second end of the composite laser cavity 30. Implementation of the second mirror 46 as a partially reflective mirror passes a fraction of the laser light from the composite cavity 30 into the silicon die 26, e.g., for use in photonics processing. As an example, the second mirror can be a loop mirror, a Bragg grating reflector or another type of mirror known in the art.

The third portion 36 of the composite laser cavity further comprises a wavelength-selective filter, WSF, 48 corresponding to a lasing mode of the semiconductor gain medium, and laser light of a selected frequency is output from the second mirror 48, e.g., for modulation via an optical modulator, MOD, 50. Thus, the wavelength-selective filter 48 ensures single-mode operation of the resulting laser.

It will be appreciated that the silicon die 26 in one or more embodiments includes further circuitry not explicitly shown in the diagram. In one such embodiment, the silicon die 26 includes one or more Central Processing Units (CPUs), or other processing circuitry, that generate data that is modulated onto the laser light passed to the optical modulation circuit 50. Such modulated signals are used, for example, for communicating with one or more other silicon dies 26 included in the laser assembly 20.

Broadly, in at least some embodiments, the second mirror 46 is partially reflective and outputs laser light, and the silicon die 26 includes an optical modulation circuit 50 configured to output an optical information signal from an optical port 52, based on modulating the laser light. Correspondingly, the glass member 24 includes a further optical waveguide 54 aligned with the optical port 52 of the silicon die 26 and configured to transfer the optical information signal to a further silicon die 26 interfaced with the glass member 24. A photonic wire bond, not shown in FIG. 2, could be employed at the interface 52 to enhance the coupling efficiency between the silicon die 26 and the optical waveguide 54. In at least one embodiment, the laser assembly 20 is configured as an integrated laser source and interfacing module for two or more silicon dies 26. The glass member 24 comprises one or more laser-scribed optical waveguides 54 operative as optical interconnects going between the two or more silicon dies 26.

In embodiments where the silicon die 26 comprises one of two or more silicon dies 26 interfaced to the glass member 24, the laser assembly 20 may include a composite laser cavity 30 for each of the two or more silicon dies 26. FIG. 2 depicts this arrangement, and each composite laser cavity 30 includes a first portion 32 formed in the III/V die 22, a second portion 34 formed in the glass member 24, and a third portion 36 formed in a respective one of the two or more silicon dies 26.

This arrangement provides a composite laser cavity 30 for each silicon die 26, to provide laser light to each silicon die 26 in the laser assembly 20. One can see that each composite laser cavity 30 includes a corresponding reflective semiconductor optical amplifier, RSOA. Further, in one or more such embodiments, or in other embodiments, the glass member 24 includes one or more laser-scribed optical waveguides 54 that serve as optical interconnects between at least one pairing of the two or more silicon dies 26.

In at least one embodiment, the laser-scribed optical waveguide 44 in the glass member 24 that is operative as the second portion 34 of the (or each) composite laser cavity 30 is scribed after mounting the III/V die 22, the silicon die 26 (or silicon dies 26), and the glass member 24. Scribing the optical waveguides 44—also referred to as "cavity waveguides"—after "rough" or "coarse" mounting or positioning of the III/V die 22 and the silicon die(s) 26 in relation to the glass member 24, greatly relaxes the required mounting alignment precision.

That is, the involved laser scribing apparatus can use fiducials or other optical reference markers and corresponding known dimensional relations to inscribe or "write" the optical waveguides 44 in precise alignment with the composite laser cavity openings/interfaces at the respective junctions between the glass member 24 and the III/V die 22, and between the glass member 24 and the silicon dies 26. Laser scribing the optical waveguides 44 and any further optical waveguides 54 used for optically interconnecting silicon dies 26 greatly relaxes the required mounting alignment precision. Additionally, the involved optical interfaces may be configured with 2D or 3D inverter tapers or adiabatic tapers, to reduce optical mode mismatches. Similarly, photonic wire bonds may be used to reduce mode mismatches at one or more of the optical interfaces.

Figure 3:
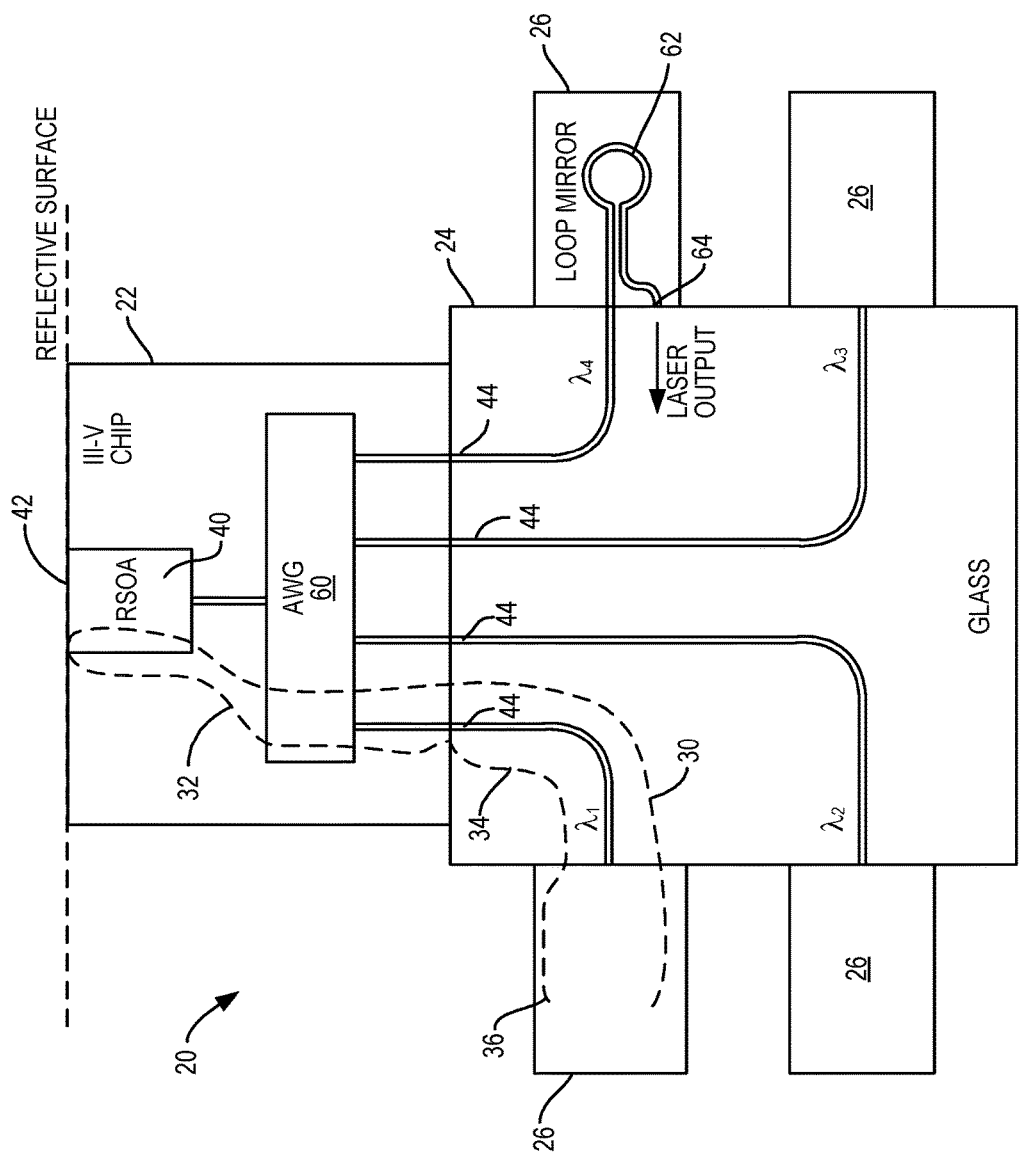
FIG. 3 is a block diagram of another embodiment of a laser assembly having a composite laser cavity.

FIG. 3 illustrates an alternative laser assembly 20 embodiment. The III/V die 22 uses a single RSOA 40 in common for two or more composite laser cavities 30. An arrayed waveguide grating, AWG, 60 optically interfaces the common RSOA 40 to each of the two or more composite laser cavities 30. Thus, in one or more embodiments, the laser assembly 20 includes two or more silicon dies 26 that partially share at least a part of the composite laser cavity 30. This arrangement is based on the III/V die 22 having a single RSOA 40 serving as a common first end of two or more composite laser cavities 30 terminated at respective ones of the two or more silicon dies 26. The III/V die 22 includes an AWG 60 that selects respective lasing wavelengths for each of the two or more silicon dies 26 and couples to a respective second portion of the composite laser cavity 30, as formed in the glass member 24 for each of the two or more silicon dies 26. The AWG design determines the laser wavelength allocated to each silicon die 26, and these wavelengths can be tuned, for example, by controlling the temperature of the AWG 60 while the wavelength spacing stays the same.

FIG. 3 also illustrates further features that can be implemented in one or more embodiments of the laser assembly 20. For example, one or more of the silicon dies 26 can include a loop mirror 62 that provides laser light at a laser output 64. This laser light may be conveyed by a corresponding optical waveguide, not illustrated, in the glass member 24, and used as the laser source for another silicon die coupled to the glass member 24. Such arrangements can supply laser light to silicon dies that are not configured to form a composite laser cavity 30 and/or can provide laser light at a different frequency to another silicon die 26.

Figure 4:
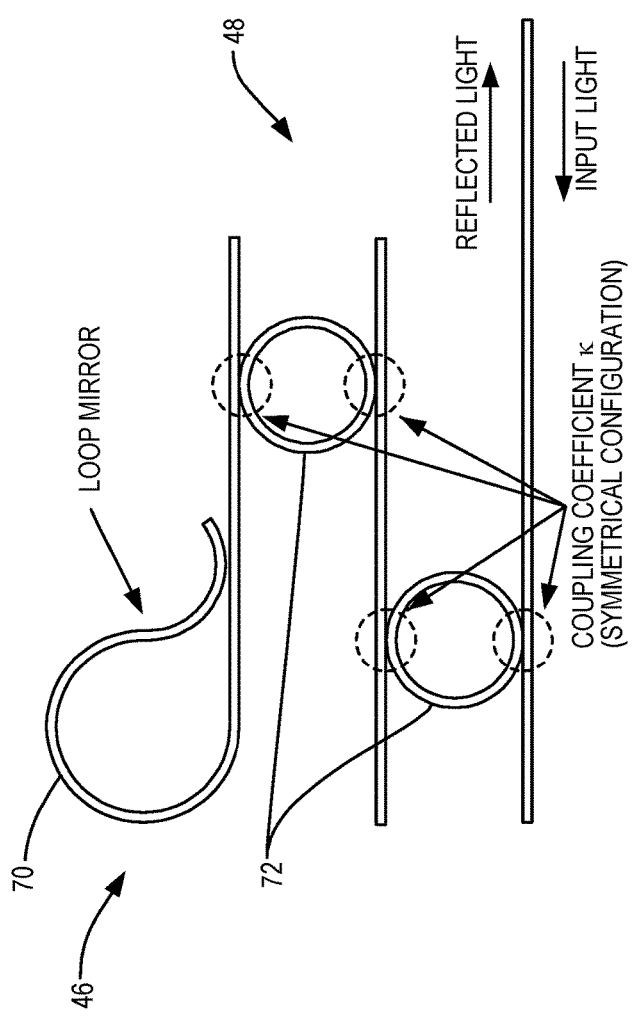
FIG. 4 is a block diagram of one embodiment of a mirror and frequency selective filter, as used in a third portion of a composite laser cavity.

FIG. 4 illustrates further implementation details used in one or more embodiments of the laser assembly 20. In one or more embodiments, the second mirror 46 comprises a waveguide formed in the involved silicon die 26 and configured as a loop mirror 70, and the wavelength-selective filter 48 comprises a ring resonator (or resonators) 72 coupled to the loop mirror 70.

Figure 5:
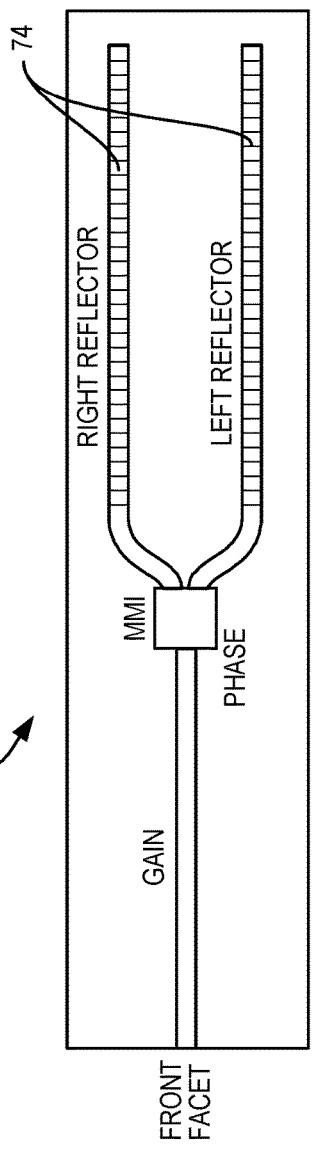
FIG. 5 is a block diagram of another embodiment of a mirror and frequency selective filter, as used in a third portion of a composite laser cavity.

FIG. 5 illustrates another embodiment of the third portion 36 of a composite laser cavity 30, wherein the involved silicon die 26 implements the second mirror 46 and the wavelength-selective filter 48 using Bragg grating reflectors 74, e.g., a "right" and a "left" Bragg grating reflector. Laser operation with this configuration relies on the Vernier effect and the left and right modulated grating reflectors 74 have a comb-shaped reflectivity spectrum. As a consequence of having different peak separations, only one pair of reflection peaks overlaps at any one time. The illustrated multi-mode interference, MMI, coupler combines both reflections, such that an aggregate reflection is seen at the optical interfacethe—front facet—at a cavity-mode frequency closest to the aggregate reflection peak.

The above details are, of course, not limiting and this disclosure broadly contemplates a type of external cavity laser that relies on femto-laser scribed waveguides formed in a glass member 24 that optically couples one or more RSOAs 40 in a III/V die 22 to respective ones among one or more silicon dies 26 mounted in relation to the glass member 24. The RSOA(s) 40 serve as the gain medium for the laser(s), and the corresponding optical waveguide(s) 44 implemented in the glass member 24 couple the RSOA(s) 40 to respective ones among one or more silicon dies 26, where each silicon die 26 completes a corresponding composite laser cavity 30.

Among other things, the contemplated laser assembly 20 and the correspondingly contemplated method of manufacturing the laser assembly, including the post-placement writing of the optical waveguides 44, may eliminate the additional alignment steps or at least lower the alignment requirements that would otherwise be needed for precisely aligning the optical waveguides at the interfaces of the III/V die 22 and the silicon die 26 with the glass member 24, if the optical waveguides 44 in the glass member 24 were preformed. In other words, the contemplated method of manufacturing the laser assembly 20 comprises mounting the III/V die 22 and silicon die(s) 26 with the glass member 24, and then scribing optical waveguides 44 along calculated three-dimensional paths through the glass member 24, to complete the involved composite laser cavity or cavities 30.

All such components may be carried on an underlying substrate and the laser assembly 20 in an overall sense may be configured as a multi-chip module, e.g., where the silicon dies 26 comprise silicon photonics chips that are provided with laser light and inter-chip optical interconnects via the glass member 24. Consequently, the laser assembly 20 provides an integrated solution that eliminates the need for optical fibers to couple external laser sources to chips or flip-chip bonding of laser dies.

Implementation of the semiconductor optical amplifier (SOA) portion(s) of the composite laser cavity or cavities 30 onboard the III/V die 22 can improve efficiency and lower manufacturing cost and complexity, as compared to bonding a III/V gain medium on each silicon die 26, and as compared to using a separate laser chip or module for each silicon die 26. Further, centralization of the active gain medium for lasing in the III/V die can simplify cooling and overall temperature control. Still further, silicon photonic components, such as micro-rings, Bragg gratings, etc., are suitable for economic implementation in the silicon die(s) 26 and can be used to fix single-mode operation of the implemented laser(s) and to enable "tuning" of the laser(s).

Micro-ring resonators, in particular, can be used to achieve single-mode laser operation with good side-mode suppression ratio. Laser cavity modes are separated by a frequency spacing of $$\Delta v = \frac{c}{2n_{eff}L},$$

where c is the speed of light, $n_{eff}$ is the effective index of refraction and L is the cavity length.

The wavelength-selective filter 48 as implemented in a silicon die 26 selects only one of the cavity modes to ensure single-mode operation of the laser. Therefore, the filter bandwidth is smaller than $\Delta v$. Tunable single-wavelength operation can be obtained by the Vernier effect in two micro-rings—such the two micro-rings 72 in FIG. 4—which have slightly different frequency-selective resonances. The lasing wavelength can be tuned by adjusting the micro-ring resonances via temperature control. Similar operation and control apply to the Bragg grating reflectors 74 seen in FIG. 5.

As a further contemplated implementation detail, a quantum dot reflective semiconductor optical amplifier, QD-RSOA, may be used to generate multiple wavelengths simultaneously. In turn, that arrangement is useful in implementations of the laser assembly 20 that use Wavelength Division Multiplexing, WDM. Comb lasers are very useful in WDM implementations, and the QD-RSOA arrangement can be used in the laser assembly 20, e.g., in the embodiment seen in FIG. 2, to generate lasers of different frequencies on the III/V die 22, for WDM operation of the silicon die(s) 26.

Notably, modifications and other embodiments will come to mind to one skilled in the art having the benefit of the teachings presented in the foregoing descriptions and the associated drawings. Therefore, it is to be understood that modifications and other embodiments are intended to be included within the scope of this disclosure. Although specific terms may be employed herein, they are used in a generic and descriptive sense only and not for purposes of limitation.

What is claimed is:

1. A laser assembly comprising:
   a III/V die configured as a semiconductor gain medium and operative as a first portion of a composite laser cavity, the first portion including a first mirror acting as a first end of the composite laser cavity;
   a glass member including a laser-scribed optical waveguide operative as a second portion of the composite laser cavity; and
   a silicon die operative as a third portion of the composite laser cavity, the third portion including a second mirror acting as a second end of the composite laser cavity.

2. The laser assembly of claim 1, wherein the third portion of the composite laser cavity further comprises a wavelength-selective filter corresponding to a lasing mode of the semiconductor gain medium.

3. The laser assembly of claim 2, wherein the wavelength-selective filter comprises a ring resonator or Bragg grating reflectors.

4. The laser assembly of claim 1, wherein the second mirror comprises a waveguide formed in the silicon die and configured as a loop mirror.

5. The laser assembly of claim 1, wherein the wavelength-selective filter comprises a ring resonator coupled to a loop mirror operative as the second mirror.

6. The laser assembly of claim 1, wherein the second mirror is partially reflective and outputs laser light, and wherein the silicon die includes an optical modulation circuit configured to output an optical information signal from an optical port, based on modulating the laser light.

7. The laser assembly of claim 6, wherein the glass member includes a further optical waveguide aligned with the optical port of the silicon die and configured to couple the optical information signal into one of: a photonics wire bond interfaced with the glass member, and a further silicon die interfaced with the glass member.

8. The laser assembly of claim 1, wherein the laser assembly is configured as an integrated laser source and interfacing module for two or more silicon dies, and wherein the glass member comprises one or more laser-scribed optical waveguides operative as optical interconnects going between the two or more silicon dies.

9. The laser assembly of claim 1, wherein the silicon die comprises one of two or more silicon dies interfaced to the glass member, and wherein the laser assembly comprises a composite laser cavity for each of the two or more silicon dies, each composite laser cavity having the first portion formed in the III/V die, the second portion formed in the glass member, and the third portion formed in a respective one of the two or more silicon dies.

10. The laser assembly of claim 1, wherein the silicon die comprises one of two or more silicon dies interfaced to the glass member, wherein the composite laser cavity is partially shared between the two or more silicon dies, based on the III/V die having a single reflective semiconductor optical amplifier serving as a common first end of two or more composite laser cavities terminated at respective ones of the two or more silicon dies, and wherein the III/V die includes an arrayed waveguide grating that selects respective lasing wavelengths for each of the two or more silicon dies and couples to a respective second portion of the composite laser cavity, as formed in the glass member for each of the two or more silicon dies.

11. The laser assembly of claim 1, wherein the silicon die comprises one of two or more silicon dies interfaced to the glass member, and wherein the laser assembly provides a composite laser cavity for each silicon die, to provide laser light to each silicon die in the laser assembly.

12. The laser assembly of claim 11, wherein the glass member includes one or more laser-scribed optical waveguides serving as optical interconnects between at least one pairing of the two or more silicon dies.

13. The laser assembly of claim 1, wherein the laser-scribed optical waveguide in the glass member that is operative as the second portion of the composite laser cavity is scribed after mounting the III/V die, the silicon die, and the glass member.

14. The laser assembly of claim 13, wherein the glass member includes a further laser-scribed waveguide serving as an optical interconnect to the silicon die and scribed after mounting the III/V die, the silicon die, and the glass member.

15. The laser assembly of claim 2, wherein the wavelength-selective filter comprises a ring resonator coupled to a loop mirror operative as the second mirror.

* * * * *